(12) United States Patent
Matthews et al.

(10) Patent No.: US 10,810,334 B2
(45) Date of Patent: Oct. 20, 2020

(54) APPLICATION STORE TEST ENVIRONMENT

(71) Applicant: General Electric Company, Schenectady, NY (US)

(72) Inventors: David Matthews, Niskayuna, NY (US); Joel Markham, Niskayuna, NY (US); Michael Yoensky, Charlottesville, VA (US); Amy Victoria Aragones, Niskayuna, NY (US); Austars Raymond Schnore, Jr., Scotia, NY (US)

(73) Assignee: General Electric Company, Schenectady, NY (US)

( * ) Notice: Subject to any disclaimer, the term of this patent is extended or adjusted under 35 U.S.C. 154(b) by 351 days.

(21) Appl. No.: 15/820,898

(22) Filed: Nov. 22, 2017

(65) Prior Publication Data

US 2019/0155970 A1   May 23, 2019

(51) Int. Cl.
*G06F 30/20*   (2020.01)
*G06F 9/455*   (2018.01)
(Continued)

(52) U.S. Cl.
CPC .............. *G06F 30/20* (2020.01); *G06F 8/61* (2013.01); *G06F 11/3664* (2013.01); *G06F 9/44505* (2013.01); *G06F 9/455* (2013.01)

(58) Field of Classification Search
USPC ............... 703/6, 22, 24; 717/107, 149, 174; 726/23
See application file for complete search history.

(56) References Cited

U.S. PATENT DOCUMENTS 6,741,672 B2 * 5/2004 Gaddipati ................. G06F 8/34
378/4
7,085,670 B2 * 8/2006 Odom .................. G06F 9/4411
702/127

(Continued)

OTHER PUBLICATIONS

Nisarg Gandhewar et al. "Google Android: An Emerging Software Platform for Mobile Devices" International Journal of computer science and Engineering (IJCSE), Page No. 01-06, 2010, 6 pp.

(Continued)

*Primary Examiner* — Thai Q Phan
(74) *Attorney, Agent, or Firm* — Buckley, Maschoff & Talwalkar LLC

(57) ABSTRACT

The example embodiments are directed to a system and method for simulating an application performance using a test environment associated with an application marketplace where the application can be purchased. In one example, the method may include operating a virtual test environment which includes virtual hardware for testing software, receiving, from the application marketplace, information about an application and operating characteristics of a target installation environment for the application, executing the application via the virtual hardware of the virtual test environment based on the operating characteristics of the target installation environment to generate simulated test results of the application in the target installation environment, and outputting information of the simulated application test results for the target installation environment for display on a display device. Accordingly, a user can simulate an application performance before purchasing and deploying the application in a larger scale.

20 Claims, 5 Drawing Sheets

(51) Int. Cl.
*G06F 8/61* (2018.01)
*G06F 11/00* (2006.01)
*G06F 11/36* (2006.01)
*G06F 9/445* (2018.01)

(56) References Cited

U.S. PATENT DOCUMENTS

| | | | |
|---|---|---|---|
| 7,958,488 B2* | 6/2011 | Cifra | G01R 31/318357 717/106 |
| 8,467,987 B1 | 6/2013 | Davidson et al. | |
| 8,601,436 B2* | 12/2013 | Park | G06F 8/30 717/107 |
| 8,776,028 B1 | 7/2014 | Enakiev et al. | |
| 8,914,504 B2 | 12/2014 | Grelewicz et al. | |
| 8,977,527 B2* | 3/2015 | McKim | G09B 9/00 703/6 |
| 9,519,572 B2 | 12/2016 | Cheng et al. | |
| 9,529,701 B2 | 12/2016 | Ekambaram et al. | |
| 2005/0063575 A1* | 3/2005 | Ma | G06F 16/58 382/128 |
| 2005/0289472 A1* | 12/2005 | Morita | G06F 3/011 715/757 |
| 2011/0307860 A1* | 12/2011 | Park | G06F 8/30 717/107 |
| 2012/0173187 A1 | 7/2012 | Lee et al. | |
| 2012/0253745 A1 | 10/2012 | Dhanapal et al. | |
| 2014/0359590 A1* | 12/2014 | Kodosky | G06F 8/451 717/149 |
| 2015/0257021 A1 | 9/2015 | Curley et al. | |
| 2016/0117158 A1* | 4/2016 | MacCleery | G06F 8/38 717/174 |
| 2017/0272316 A1* | 9/2017 | Johnson | H04L 61/301 |
| 2018/0262388 A1* | 9/2018 | Johnson | G06F 9/448 |
| 2019/0095547 A9* | 3/2019 | Clark | G06F 13/00 |

OTHER PUBLICATIONS

Rajesh Vasa et al. "A Preliminary Analysis of Mobile App User Reviews" Journal of Swinburne University, Page No. 01-04, Nov. 2012, 4 pp.

* cited by examiner

APPLICATION STORE TEST ENVIRONMENT

BACKGROUND

Machine and equipment assets are engineered to perform particular tasks as part of a process. For example, assets can include, among other things and without limitation, industrial manufacturing equipment on a production line, drilling equipment for use in mining operations, wind turbines that generate electricity on a wind farm, transportation vehicles, gas and oil refining equipment, and the like. As another example, assets may include devices that aid in diagnosing patients such as imaging devices (e.g., X-ray or MM systems), monitoring equipment, and the like. The design and implementation of these assets often takes into account both the physics of the task at hand, as well as the environment in which such assets are configured to operate.

Low-level software and hardware-based controllers have long been used to drive machine and equipment assets. However, the rise of inexpensive cloud computing, increasing sensor capabilities, and decreasing sensor costs, as well as the proliferation of mobile technologies, have created opportunities for creating novel industrial and healthcare based assets with improved sensing technology and which are capable of transmitting data that can then be distributed throughout a network. As a consequence, there are new opportunities to enhance the business value of some assets through the use of novel industrial-focused hardware and software.

Software applications and other programs are often used as part of a process for enhancing, analyzing, controlling or otherwise interacting with an asset such as a machine or equipment that is used in industry, manufacturing, healthcare, transportation, or the like. Environments in which the asset is disposed, software already added to the asset, input data, and many other factors can influence the way that software performs. This influence can be different across different operating environment. For example, the same asset (e.g., type or model) may perform differently in different operating environments as a result of many possible factors.

As a result, it can be difficult to accurately predict how a software application will perform in a specific environment with relative accuracy. It is often only after a customer has purchased an application (e.g., downloaded and installed the application) that they can accurately determine how the application is going to interact with a respective execution environment that is particular to the customer. As a result, a customer may determine that an application is not adequate or that there are other applications that perform better but must purchase all applications to make such determination.

SUMMARY

According to an aspect of an example embodiment, a method may include one or more of operating a virtual test environment in association with an application marketplace, the virtual test environment comprising virtual hardware for testing software, receiving, from the application marketplace, information about an application and one or more operating characteristics of a target installation environment for the application, executing the application via the virtual hardware of the virtual test environment based on the one or more operating characteristics of the target installation environment to generate simulated test results of the application in the target installation environment, and outputting information concerning the simulated application test results for the target installation environment for display on a display device.

According to an aspect of another example embodiment, a computing system may include one or more of a processor configured to operate a virtual test environment in association with an application marketplace, the virtual test environment including virtual hardware for testing software, receive, from the application marketplace, information about an application and one or more operating characteristics of a target installation environment for the application, and execute the application via the virtual hardware of the virtual test environment based on the one or more operating characteristics of the target installation environment to generate simulated test results of the application in the target installation environment. The computing system may also include an output configured to output information concerning the simulated application test results for the target installation environment for display on a display device.

Other features and aspects may be apparent from the following detailed description taken in conjunction with the drawings and the claims.

BRIEF DESCRIPTION OF THE DRAWINGS

Features and advantages of the example embodiments, and the manner in which the same are accomplished, will become more readily apparent with reference to the following detailed description taken in conjunction with the accompanying drawings.

Figure 1:
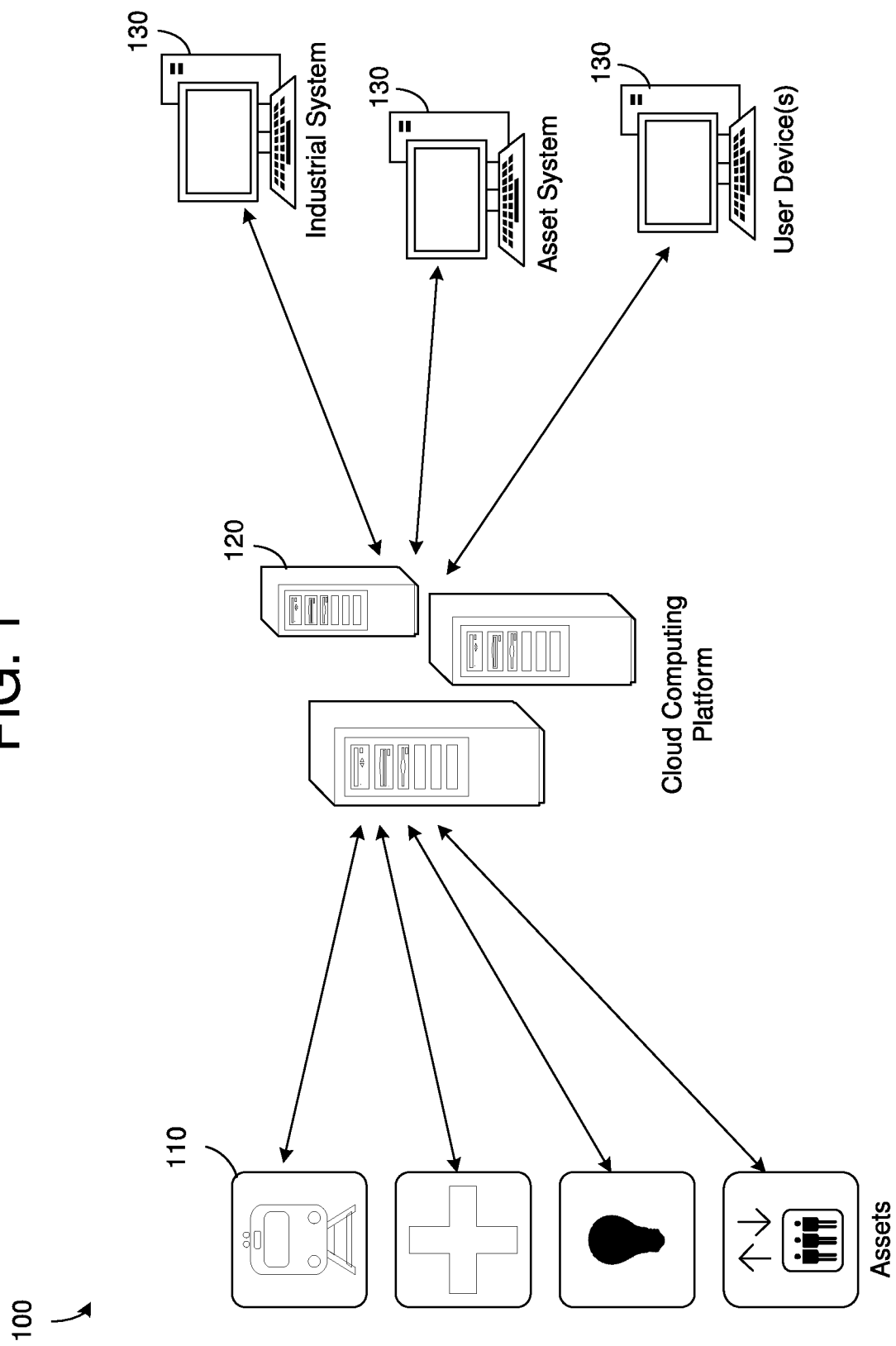
FIG. 1 is a diagram illustrating a cloud computing system for industrial software and hardware in accordance with an example embodiment.

Throughout the drawings and the detailed description, unless otherwise described, the same drawing reference numerals will be understood to refer to the same elements, features, and structures. The relative size and depiction of these elements may be exaggerated or adjusted for clarity, illustration, and/or convenience.

DETAILED DESCRIPTION

In the following description, specific details are set forth in order to provide a thorough understanding of the various example embodiments. It should be appreciated that various modifications to the embodiments will be readily apparent to those skilled in the art, and the generic principles defined herein may be applied to other embodiments and applications without departing from the spirit and scope of the disclosure. Moreover, in the following description, numerous details are set forth for the purpose of explanation. However, one of ordinary skill in the art should understand that embodiments may be practiced without the use of these specific details. In other instances, well-known structures and processes are not shown or described in order not to obscure the description with unnecessary detail. Thus, the present disclosure is not intended to be limited to the embodiments shown, but is to be accorded the widest scope consistent with the principles and features disclosed herein.

The example embodiments are directed to a system and method for simulating an application performance based on target operating environment characteristics prior to a user purchasing and downloading the application. The system may operate an application marketplace (e.g., application store, app store, etc.) through which an application can be accessed, downloaded, and installed. The system may also generate and operate a test environment as an extension of the application marketplace. For example, the application marketplace may provide a test simulation environment that enables a user to configure various platform settings (e.g., hardware and/or software constraints) of a target installation environment and simulate the execution of the application prior to downloading the application to the target installation environment. Accordingly, a user can preview how the application will operate based on one or more user-specific criteria such as custom input data, custom platform settings, custom software settings, or the like, prior to downloading the application. In some embodiments, the application marketplace may be an industrial application marketplace associated with various manufacturing and industrial environments. The application may be previewed and tested before it is deployed on a larger scale at a manufacturing site, etc.

An application marketplace refers to a digital distribution platform for software. An application marketplace may organize the apps that it offers based on various factors including functions provided by the app (e.g., games, multimedia, productivity, etc.), a device for which the app was designed, an operating system on which the app will run, and the like. The application marketplace may take the form of an online store, where users can browse through different applications and categories, view information about each app (such as reviews or ratings), and acquire the application. A selected application may be offered as an automatic download, after which the application installs in the target download environment. An application marketplace may include different software applications published by distinct software developers. The application marketplace may receive a uniform resource locator (URL) of an application used to launch the application, screen shots, one or more icons, a manifest file, and the like, from the developer of the application desiring to publish the application through the application marketplace. After the application is submitted, it is often reviewed to ensure various requirements (e.g., security, operation, etc.) and when approved it is made available via the application marketplace.

Software applications may be downloaded from an application marketplace and installed by a control system of an industrial asset or a manufacturing plant including a plurality of assets which operate to perform a business process. For example, optimization software may be used by an asset or a control system of the asset to add life to the asset or its components by changing speeds, power levels, operating conditions, and the like. As another example, optimization applications may be used to improve a level of manufacturing output (e.g., speed) by the asset, a quality of the manufacturing of the asset, and the like. However, before a user downloads an application, it can be beneficial to determine if the application will work with particular characteristics of the target installation environment including software constraints, hardware constraints, and the like.

The test environment provided herein is made available via an application marketplace to a user prior to download (and even purchasing) of a software application. Furthermore, the test environment includes settings that are customizable by the user thereby enabling the user to modify operating characteristics of the simulation environment to correspond to the actual operating characteristics of the user system. Accordingly, the user may test a performance of the application for a target platform before they deploy it on a large scale. In contrast, current practice typically requires the host or user to launch an application on-site and perform user-specific configurations on-site after the application has already been deployed. However, the testing is very labor intensive because testing has not been automated. As a result, testing can take a significant toll on the user as well as the host of the software application.

The test environment may be customized using various hardware and software constraints that can be modified by a user. In some embodiments, the hardware constraints may include storage capacity, processor capacity (e.g., type), a version of the hardware, data connection rates, device type (server, gateway, controller, etc.), and the like. Meanwhile, as another example, the software constraints may include a type and version of the operating system that's running the software, types and versions of other platform software, and the like. Other configuration settings may also be adjusted such as a safe operating area (e.g., safe zone), and the like. The application marketplace may provide a graphical user interface (GUI) that allows the user to set constraints or operating parameters of the execution environment through various selections (e.g., drop-downs, pop-ups, check-boxes, fields, etc.) which gives the user the capability to test the application in their configuration or their particular use case. In some embodiments, the operating characteristics of the operating environment and/or the application can be modified by the user during testing. For example, the application can be modified based on metadata extracted from the application which provides information such as certification information, validation information, and the like, for the software application.

The system and method described herein may be implemented via a program or other software that may be used in conjunction with applications for managing machine and equipment assets hosted within an Industrial Internet of Things (IIoT). An IIoT may connect assets, such as turbines, jet engines, locomotives, elevators, healthcare devices, mining equipment, oil and gas refineries, and the like, to the Internet or cloud, or to each other in some meaningful way such as through one or more networks. The software program described herein can be implemented within an application marketplace deployed in a "cloud" or remote or distributed computing resource. The cloud can be used to receive, relay, transmit, store, analyze, or otherwise process information for or about assets and manufacturing sites. In an example, a cloud computing system includes at least one processor circuit, at least one database, and a plurality of users and/or assets that are in data communication with the cloud computing system. The cloud computing system can further include or can be coupled with one or more other processor circuits or modules configured to perform a specific task, such as to perform tasks related to asset maintenance, analytics, data storage, security, or some other function.

FIG. 1 illustrates a cloud computing system 100 for industrial software and hardware in accordance with an example embodiment. Referring to FIG. 1, the system 100 includes a plurality of assets 110 which may be included within an IIoT and which may transmit raw data to a source such as cloud computing platform 120 where it may be stored and processed. It should also be appreciated that the cloud platform 120 in FIG. 1 may be replaced with or supplemented by a non-cloud based platform such as a server, an on-premises computing system, and the like. The data transmitted by the assets 110 and received by the cloud platform 120 may include data that is being input to hardware and/or software deployed on or in association with the assets 110, raw time-series data output as a result of the operation of the assets 110, and the like. Data that is stored and processed by the cloud platform 120 may be output in some meaningful way to industrial computing systems 130. In the example of FIG. 1, the assets 110, cloud platform 120, and the industrial computing systems 130 may be connected to each other via a network such as the Internet, a private network, a wired network, a wireless network, etc. Also, the industrial computing systems 130 may interact with software hosted by and deployed on the cloud platform 120 in order to receive data from and control operation of the assets 110.

According to various aspects, software applications that can be used to enhance or otherwise in conjunction with the operation of an asset 110 may be hosted by the cloud platform 120 and may interact with the asset 110. For example, software applications may be used to optimize a performance of the assets 110 or data coming in from the asset 110. As another example, the software applications may analyze, control, manage, or otherwise interact with the asset 110 and components (software and hardware) thereof. An industrial computing system 130 (e.g., edge PC coupled to an asset, asset controlling computing system for controlling an asset, a gateway, a user device, etc.) may receive views of data or other information about the asset 110 as the data is processed via one or more applications hosted by the cloud platform 120. For example, the industrial computing system 130 may receive graph-based results, diagrams, charts, warnings, measurements, power levels, and the like. As another example, the industrial computing system 130 may display a graphical user interface (GUI) that allows a user to input commands to an asset 110 via one or more applications hosted by the cloud platform 120.

In this example, an asset management platform (AMP) can reside within or be connected to the cloud platform 120, in a local or sandboxed environment, or can be distributed across multiple locations or devices and can be used to interact with the assets 110. The AMP can be configured to perform functions such as data acquisition, data analysis, data exchange, and the like, with local or remote assets 110, or with other task-specific processing devices. For example, the assets 110 may be an asset community (e.g., turbines, healthcare, power, industrial, manufacturing, mining, oil and gas, elevator, etc.) which may be communicatively coupled to the cloud platform 120 via one or more intermediate devices such as a stream data transfer platform, database, or the like.

Information from the assets 110 may be communicated to the cloud platform 120. For example, external sensors can be used to sense information about a function of an asset, or to sense information about an environment condition at or around an asset, a worker, a downtime, a machine or equipment maintenance, and the like. The external sensor can be configured for data communication with the cloud platform 120 which can be configured to store the raw sensor information and transfer the raw sensor information to the industrial computing systems 130 where it can be accessed by users, applications, systems, and the like, for further processing. Furthermore, an operation of the assets 110 may be enhanced or otherwise controlled by a user inputting commands though an application hosted by the cloud platform 120 or other remote host platform such as a web server. The data provided from the assets 110 may include time-series data or other types of data associated with the operations being performed by the assets 110

In some embodiments, the cloud platform 120 may include a local, system, enterprise, or global computing infrastructure that can be optimized for industrial data workloads, secure data communication, and compliance with regulatory requirements. The cloud platform 120 may include a database management system (DBMS) for creating, monitoring, and controlling access to data in a database coupled to or included within the cloud platform 120. The cloud platform 120 can also include services that developers can use to build or test industrial or manufacturing-based applications and services to implement IIoT applications that interact with assets 110.

For example, the cloud platform 120 may host an industrial application marketplace where developers can publish their distinctly developed applications and/or retrieve applications from third parties. In addition, the cloud platform 120 can host a development framework for communicating with various available services or modules. The development framework can offer developers a consistent contextual user experience in web or mobile applications. Developers can add and make accessible their applications (services, data, analytics, etc.) via the cloud platform 120. Also, analytic software may analyze data from or about a manufacturing process and provide insight, predictions, and early warning fault detection.

According to various aspects, prior to downloading and installing an application hosted by the cloud platform 120, a user of industrial computing system 130 may test the application based on one or more hardware and software configurations of the user-specific system. Here, the user system may include at least one asset 110. Also, the user system may include a control system, one or more other assets, additional computers, machines, equipment, and the like, which may be used to perform manufacturing and industrial operations. Collectively, the user system may be referred to as a target system or a target application installation environment that includes software, hardware, or a combination of both software and hardware. The user may interact with the application marketplace hosted by cloud platform 120 (or hosted by a web server not shown) to view available applications. The user may launch the test environment described herein via the application marketplace to test operating environment characteristics of the users target installation environment.

Figure 2:
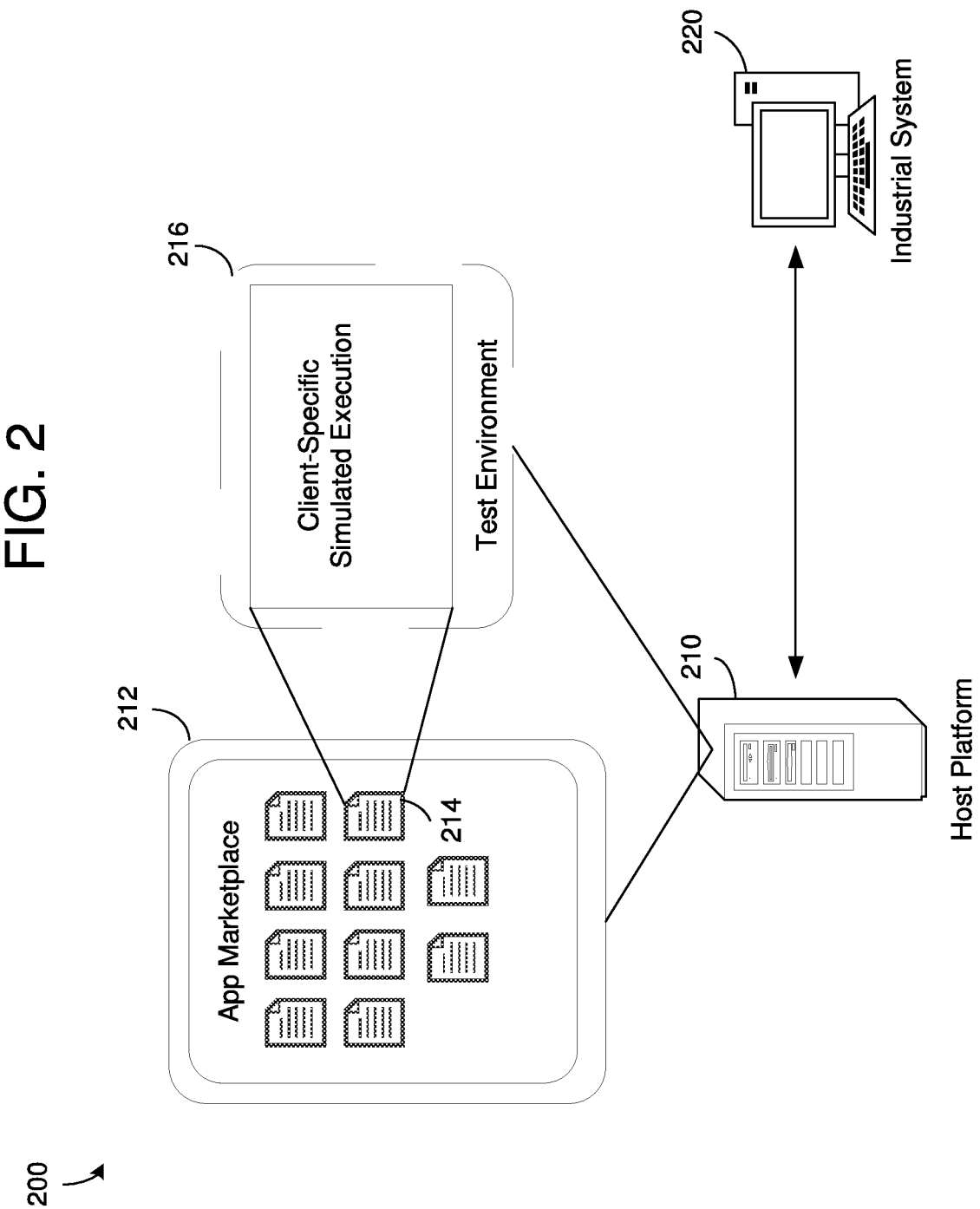
FIG. 2 is a diagram illustrating a system for deploying a test environment via an application marketplace in accordance with an example embodiment.

FIG. 2 illustrates a system 200 for deploying a test environment 216 via an application marketplace 212 in accordance with an example embodiment. The system 200 may be the system 100 shown in FIG. 1, or it may be a different system. Referring to FIG. 2, the system 200 includes a host platform 210 which hosts the application marketplace 212 and an industrial computing system 220 connected to the host platform 210 via a network such as the Internet, private network, or the like. A user of the industrial computing system 220 may browse applications included in the application marketplace 212. Prior to downloading an application 214 from the host platform 210 via the application marketplace 212, the user device 220 may request or otherwise trigger a simulation of the application 214 via the test environment 216. In some embodiments, the test environment 216 may be an extension of the application marketplace 212 and may be managed by the host platform 210. As another example, the test environment 216 may be a separate application triggered by the application marketplace 212 and be capable of communicating with the application marketplace 212 via an application programming interface (API) and the like.

The test environment 216 may include test beds/hardware capable of executing the application 214 and which can be made available to a user prior to download of the application 214. As a non-limiting example, the application marketplace 212 may include a button or other selection capable of being selected by the user to trigger launching of the test environment 216. As another example, the test environment 216 may be continuously running or it may be launched automatically in response to an event such as the user entering the application marketplace 212. The application 214 may be used to monitor, control, predict operating characteristics, or otherwise interact with one or more assets coupled to or otherwise associated with the industrial computing system 220.

Furthermore, the hardware and the software included in the test environment 216 may be configurable such that they can be customized by the user to match a target installation and execution environment of the user. That is, the target installation and execution environment is a potential destination for deploying the application 214. In various embodiments, the user through the industrial computing system 220 can adjust software constraints, hardware constraints, safe areas, network settings, and the like, of the operating characteristics of the test environment 216 thereby enabling the user to modify operating characteristics of the simulation environment to correspond to the actual operating characteristics of a target system. Accordingly, the user may test a performance of the application for a target platform before they deploy it on a large scale.

Various factors of an operating environment can influence whether a software application will work properly including hardware/platform characteristics, software already present on the system, input data, and the like. The user may perform various tests on the software application 214 via the test environment 216 to verify that the application 214 will work properly in the target installation environment of the user. The testing may include validation, certification, quality assurance, and the like. Based on the testing, results may be output for display to the industrial computing system 220. In some embodiments, the application 214 may be executed and tested in the test environment 216 using data from the asset or a similar asset that is associated with the industrial computing system 220. For example, the asset data can be raw data streamed from the asset, pre-stored data from the asset (or a similar asset), or the like.

According to various aspects, the test environment 216 may be customized using one or more hardware and/or software constraints that can be implemented by the test environment 216. The customized constraints can be used to simulate a download environment for the application 214 prior to being downloaded. For example, the hardware constraints may include storage capacity, processor capacity, a version of the hardware, data connection rates, device type (server, gateway, controller, etc.), and the like. As another example, the software constraints may include a type and version of the operating system that's running the software, types and versions of other platform software, and the like. Accordingly, the test environment 216 can run the application 214 based on the customized constraints.

Figure 3:
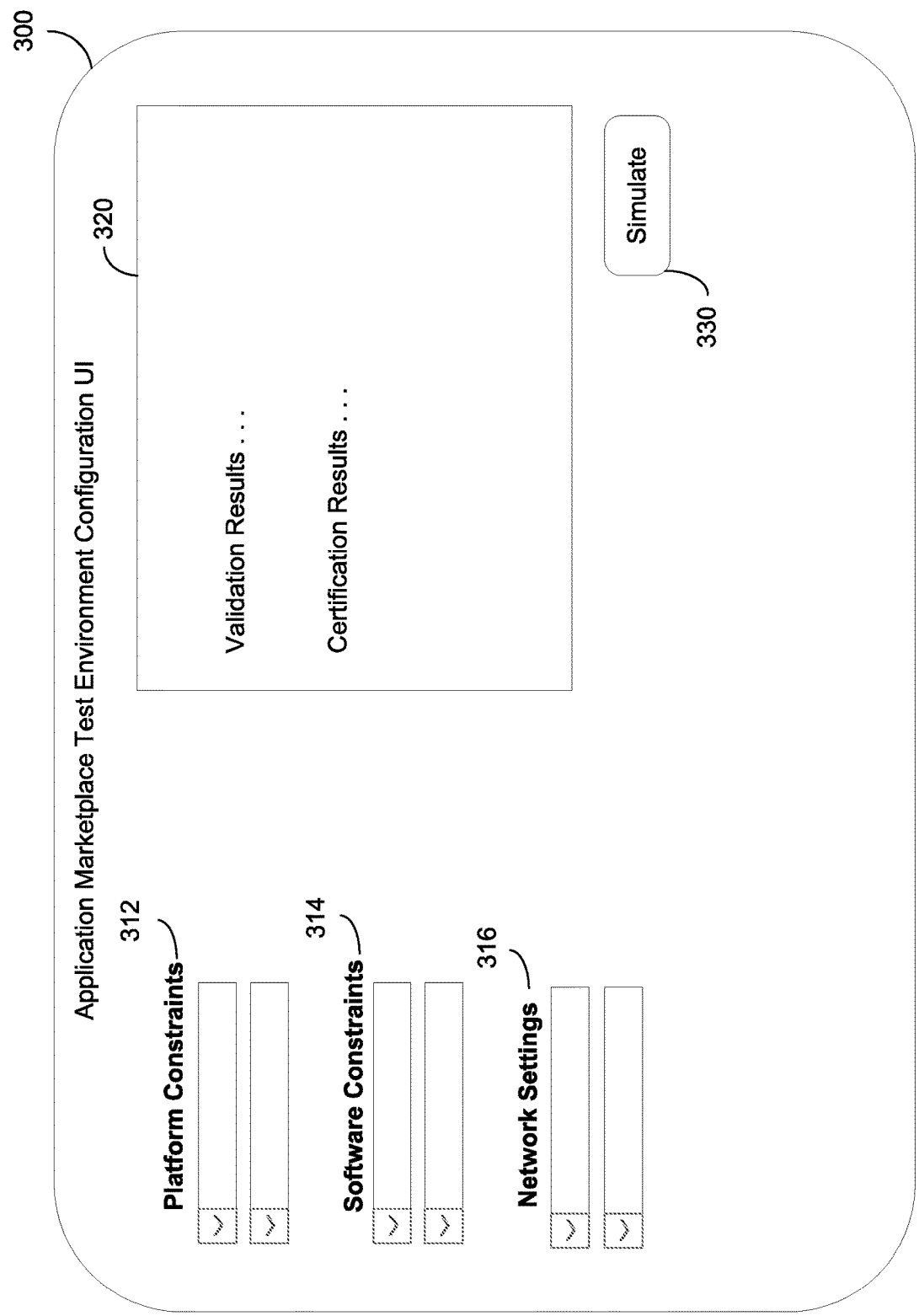
FIG. 3 is a diagram illustrating a user interface for configuring a test environment with installation environment constraints in accordance with example embodiments.

In some embodiments, the application marketplace 212 may also provide a user interface 300 as shown in FIG. 3 which enables a user to configure a test environment with installation environment constraints 312, 314, and 316 in accordance with example embodiments. In this example, the user may select platform constraints 312, software constraints 314, and network settings 316. However, the installation environment configurable settings are not limited thereto. The test environment also includes a window 320 which can output results of the testing as well as a selection 330 for simulating the execution of the application based on the constraints that have been selected. In some embodiments, the platform constraints 312, the software constraints 314, and/or the network settings 316 may be populated with options based on metadata extracted by the application marketplace and implemented via the user interface 300.

Figure 4:
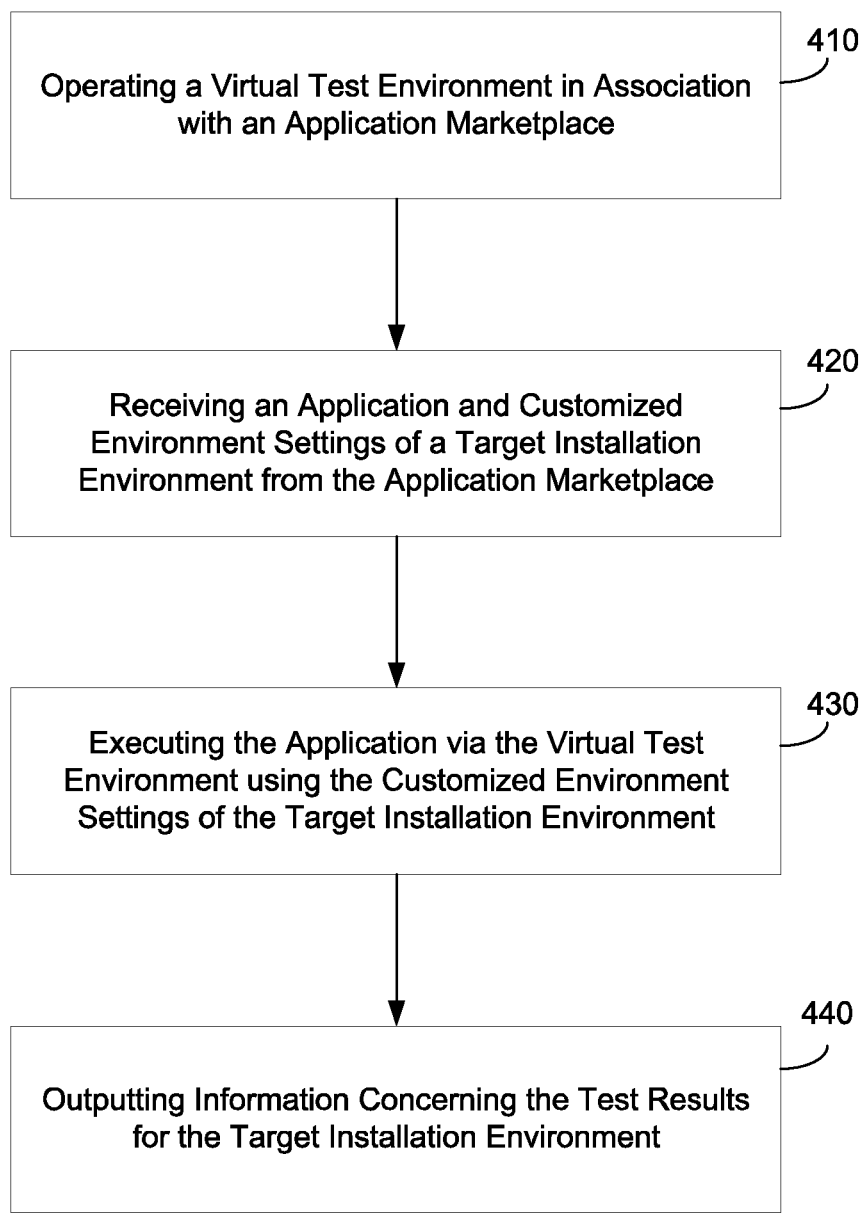
FIG. 4 is a diagram illustrating a method for managing a test environment via an application marketplace in accordance with an example embodiment.

FIG. 4 illustrates a method 400 for managing a test environment via an application marketplace in accordance with an example embodiment. For example, the method 400 may be performed by a server, a cloud computing platform, a database, a computing system, a user device, and the like. Referring to FIG. 4, in 410, the method includes operating a virtual test environment in association with an application marketplace, the virtual test environment including virtual hardware for testing software. In some embodiments, the method may also include launching the test environment based on an autonomous request from the application marketplace, a request from a user, and the like. In 420, the method includes receiving application information and one or more operating characteristics of a target installation environment for the application from the application marketplace. For example, the application information may include an executable file which can be launched in the test environment, as well as metadata associated with the application. The target installation environment may include a control system associated with an industrial plant and the application may include an industrial application configured for installation and execution at the control system. The operating characteristics may include hardware constraints, software constraints, application constraints, network constraints, and the like, of the target system.

In 430, the method includes executing the application via the virtual hardware of the virtual test environment based on the one or more customized environment settings of the target installation environment to simulate application test results for the target installation environment, and in 440, the method includes outputting information concerning the simulated application test results for the target installation environment for display on a display device. For example, the executing of the application may include inputting target installation environment source data to the application to generate target-based output test data.

In some embodiments, the executing of the application may include modifying the virtual hardware of the virtual test environment to correspond to one or more hardware settings of the target installation environment hardware settings, and executing the application via the modified virtual hardware. In some embodiments, the executing of the application may include executing one or more of a certification process and a validation process on the application with respect to the target installation environment. Furthermore, the executing of the application and the outputting of the test results are performed prior to installing the application in the target installation environment. That is, the application may be tested via the simulation environment of the application marketplace prior to a user purchasing the application thereby enabling a user to see how well an application will perform in the user's specific target system.

Although not shown in FIG. 4, in some embodiments, the method may include extracting metadata of the application from the application marketplace, generating one or more user selections for the one or more customized environment settings, and outputting the one or more selections for configuration via a user interface associated with the application marketplace. For example, the selections may be output via a user interface that enables the user to configure the various hardware and/or software constraints of the operating characteristics of the test environment. Accordingly, the user may easily configure the settings by choosing from selections that are automatically populated based on metadata of the application.

Figure 5:
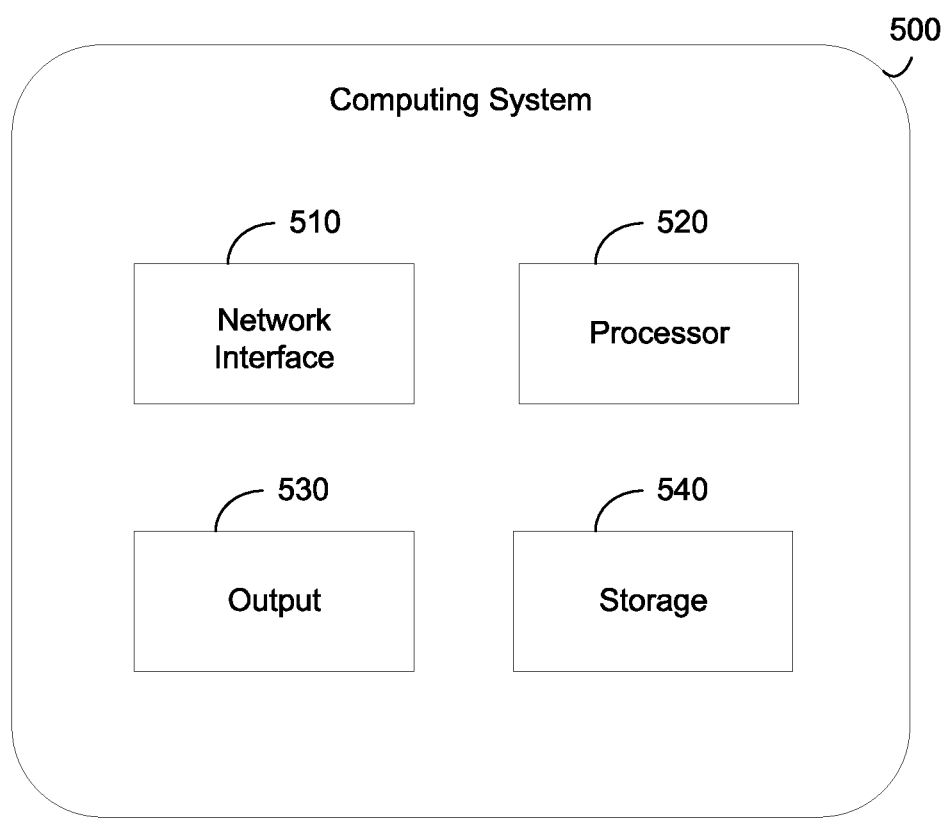
FIG. 5 is a diagram illustrating a computing system for managing a test environment via an application marketplace in accordance with an example embodiment.

FIG. 5 illustrates a computing system for managing a test environment via an application marketplace in accordance with an example embodiment. For example, the computing system 500 may be a database, cloud platform, streaming platform, user device, and the like. As a non-limiting example, the computing system 500 may be the cloud platform 120 shown in FIG. 1. In some embodiments, the computing system 500 may be distributed across multiple devices. Also, the computing system 500 may perform the method 400 of FIG. 4. Referring to FIG. 5, the computing system 500 includes a network interface 510, a processor 520, an output 530, and a storage device 540 such as a memory. Although not shown in FIG. 5, the computing system 500 may include other components such as a display, an input unit, a receiver, a transmitter, and the like.

The network interface 510 may transmit and receive data over a network such as the Internet, a private network, a public network, and the like. The network interface 510 may be a wireless interface, a wired interface, or a combination thereof. The processor 520 may include one or more processing devices each including one or more processing cores. In some examples, the processor 520 is a multicore processor or a plurality of multicore processors. Also, the processor 520 may be fixed or it may be reconfigurable. The output 530 may output data to an embedded display of the computing system 500, an externally connected display, a display connected to the cloud, another device, and the like. The storage device 540 is not limited to a particular storage device and may include any known memory device such as RAM, ROM, hard disk, and the like, and may or may not be included within the cloud environment. The storage 540 may store software modules or other instructions which can be executed by the processor 520 to perform the method 400 shown in FIG. 4. Also, the storage 540 may store software programs and applications which can be downloaded and installed by a user. Furthermore, the storage 540 may store and the processor 520 may execute an application marketplace that makes the software programs and applications available to users that connect to the computing system 500.

According to various embodiments, the processor 520 may operate and manage a virtual test environment in association with an application marketplace. For example, the virtual test environment may include virtual hardware for testing software. The processor 520 may receive, from the application marketplace, information about an application and one or more operating characteristics of a target installation environment for the application. The operating characteristics may be target-specific hardware and/or software constraints of a potential download and install environment where the application may be deployed. The processor 520 may execute the application via the virtual hardware of the virtual test environment based on the one or more operating characteristics of the target installation environment to generate simulated test results of the application in the target installation environment. For example, the simulation may be performed prior to a user purchasing the application thereby providing the user with performance capabilities of the application on the user's specific target system. Furthermore, the output 530 may output information concerning the simulated application test results for the target installation environment for display on a display device.

In some embodiments, the target installation environment may include a control system associated with an industrial plant and the application comprises an industrial application configured for installation and execution at the control system. In this example, the one or more operating characteristics of the target installation environment may include one or more of network settings of the industrial plant, hardware capabilities of the control system, other software stored on the control system, control system software settings used by the control system, other assets and devices at the plant, and the like.

In some embodiments, the processor 520 may extract metadata of the application from the application marketplace and generate one or more user selections for configuring the one or more operating characteristics of the target installation environment, and the output 530 may output the one or more selections via a user interface associated with the application marketplace. The user interface may provide various selections to ease the configuration process for a user. The user interface may be an extension of the application marketplace and extract data and metadata from applications added to or included in the application marketplace.

During simulation, the processor 520 may input target installation environment source data into the application to generate target-based output test data. In some embodiments, the processor 520 may modify the virtual hardware of the virtual test environment to correspond to target hardware settings included in the one or more operating characteristics of the target installation environment, and execute the application via the modified virtual hardware. The processor 520 may execute one or more of a certification process and a validation process on the application with respect to the target installation environment. In some embodiments, the processor 520 may launch the virtual test environment as an extension of the application marketplace in response to receiving a request from the application marketplace. In some embodiments, the processor 520 may execute the application and the output outputs the test results prior to the processor installing the application in the target installation environment.

As will be appreciated based on the foregoing specification, the above-described examples of the disclosure may be implemented using computer programming or engineering techniques including computer software, firmware, hardware or any combination or subset thereof. Any such resulting program, having computer-readable code, may be embodied or provided within one or more non-transitory computer readable media, thereby making a computer program product, i.e., an article of manufacture, according to the discussed examples of the disclosure. For example, the non-transitory computer-readable media may be, but is not limited to, a fixed drive, diskette, optical disk, magnetic tape, flash memory, semiconductor memory such as read-only memory (ROM), and/or any transmitting/receiving medium such as the Internet, cloud storage, the internet of things, or other communication network or link. The article of manufacture containing the computer code may be made and/or used by executing the code directly from one medium, by copying the code from one medium to another medium, or by transmitting the code over a network.

The computer programs (also referred to as programs, software, software applications, "apps", or code) may include machine instructions for a programmable processor, and may be implemented in a high-level procedural and/or object-oriented programming language, and/or in assembly/machine language. As used herein, the terms "machine-readable medium" and "computer-readable medium" refer to any computer program product, apparatus, cloud storage, internet of things, and/or device (e.g., magnetic discs, optical disks, memory, programmable logic devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal that may be used to provide machine instructions and/or any other kind of data to a programmable processor.

The above descriptions and illustrations of processes herein should not be considered to imply a fixed order for performing the process steps. Rather, the process steps may be performed in any order that is practicable, including simultaneous performance of at least some steps. Although the disclosure has been described in connection with specific examples, it should be understood that various changes, substitutions, and alterations apparent to those skilled in the art can be made to the disclosed embodiments without departing from the spirit and scope of the disclosure as set forth in the appended claims.

What is claimed is:

1. A computer-implemented method comprising:
    displaying an application marketplace comprising an online marketplace where software applications can be browsed and selected for download;
    receiving, via a user interface of the application marketplace, input comprising a request to simulate an application currently being browsed within the application marketplace and input comprising one or more operating characteristics of a target installation environment for the application;
    executing the application via a virtual test environment that extends from the application marketplace based on the one or more operating characteristics of the target installation environment to generate simulated test results of the application in the target installation environment; and
    outputting information concerning the simulated application test results for the target installation environment for display on a display device.

2. The method of claim 1, wherein the target installation environment comprises a control system associated with an industrial plant and the application comprises an industrial application configured for installation and execution at the control system.

3. The method of claim 1, wherein the one or more operating characteristics of the target installation environment comprise at least one of an operating system type and an operating system version of a device where the target installation environment is located.

4. The method of claim 1, further comprising extracting metadata of the application from the application marketplace, generating one or more user selections for configuring the one or more operating characteristics of the target installation environment, and outputting the one or more selections via a user interface associated with the application marketplace.

5. The method of claim 1, wherein the executing of the application comprises inputting target installation environment source data into the application to generate target-based output test data.

6. The method of claim 1, wherein the executing of the application comprises modifying virtual hardware of the virtual test environment to correspond to target hardware settings included in the one or more operating characteristics of the target installation environment, and executing the application via the modified virtual hardware.

7. The method of claim 1, wherein the executing of the application comprises executing one or more of a certification process and a validation process on the application with respect to the target installation environment.

8. The method of claim 1, further comprising launching the virtual test environment as an extension of the application marketplace in response to receiving a request from the application marketplace.

9. The method of claim 1, wherein the executing of the application and the outputting of the test results are performed prior to installing the application in the target installation environment.

10. A computing system comprising:
    a processor configured to
        display an application marketplace comprising an online marketplace where software applications can be browsed and selected for download,
        receive, via a user interface of the application marketplace, input comprising a request to simulate an application currently being browsed within the application marketplace and input comprising one or more operating characteristics of a target installation environment for the application, and
        execute the application via a virtual test environment that extends from the application marketplace based on the one or more operating characteristics of the target installation environment to generate simulated test results of the application in the target installation environment; and
    an output configured to output information concerning the simulated application test results for the target installation environment for display on a display device.

11. The computing system of claim 10, wherein the target installation environment comprises a control system associated with an industrial plant and the application comprises an industrial application configured for installation and execution at the control system.

12. The computing system of claim 10, wherein the one or more operating characteristics of the target installation environment comprise at least one of an operating system type and an operating system version of a device where the target installation environment is located.

13. The computing system of claim 10, wherein the processor is further configured to extract metadata of the application from the application marketplace and generate one or more user selections for configuring the one or more operating characteristics of the target installation environment, and the output is configured to output the one or more selections via a user interface associated with the application marketplace.

14. The computing system of claim 10, wherein the processor is configured to input target installation environment source data into the application to generate target-based output test data.

15. The computing system of claim 10, wherein the processor is configured to modify virtual hardware of the virtual test environment to correspond to target hardware settings included in the one or more operating characteristics of the target installation environment, and execute the application via the modified virtual hardware.

16. The computing system of claim 10, wherein the processor is configured to execute one or more of a certification process and a validation process on the application with respect to the target installation environment.

17. The computing system of claim 10, wherein the processor is further configured to launch the virtual test environment as an extension of the application marketplace in response to receiving a request from the application marketplace.

18. The computing system of claim 10, wherein the processor executes the application and the output outputs the test results prior to the processor installing the application in the target installation environment.

19. A non-transitory computer readable medium having stored therein instructions that when executed cause a computer to perform a method comprising:
  displaying an application marketplace comprising an online marketplace where software applications can be browsed and selected for download;
  receiving, via a user interface of the application marketplace, input comprising a request to simulate an application currently being browsed within the application marketplace and input comprising one or more operating characteristics of a target installation environment for the application;
  executing the application via a virtual test environment that extends from the application marketplace based on the one or more operating characteristics of the target installation environment to generate simulated test results of the application in the target installation environment; and
  outputting information concerning the simulated application test results for the target installation environment for display on a display device.

20. The non-transitory computer readable medium of claim 19, wherein the executing of the application comprises modifying virtual hardware of the virtual test environment to correspond to target hardware settings included in the one or more operating characteristics of the target installation environment, and executing the application via the modified virtual hardware.

* * * * *